United States Patent [19]

Zahir et al.

[11] 3,956,043

[45] May 11, 1976

[54] PROCESS FOR THE MANUFACTURE OF PRINTED MULTI-LAYER CIRCUITS

[75] Inventors: Abdul-Cader Zahir, Reinach; Heinz Remabold, Arlesheim; Ewald Losert, Birsfelden, all of Switzerland

[73] Assignee: Ciba-Geigy Corporation, Ardsley, N.Y.

[22] Filed: Aug. 20, 1973

[21] Appl. No.: 389,910

[30] Foreign Application Priority Data

Aug. 25, 1972 Switzerland............... 12658/72

[52] U.S. Cl. .................... 156/3; 96/35.1; 96/115 R; 156/13; 156/18
[51] Int. Cl.² ........................ G03C 1/68
[58] Field of Search ............ 96/115 R, 35.1; 260/47 EP; 156/292; 153/3, 13, 18

[56] References Cited
UNITED STATES PATENTS

| | | | |
|---|---|---|---|
| 3,295,974 | 1/1967 | Erdmann | 96/115 R |
| 3,418,295 | 12/1968 | Schoenthaler | 96/115 R |
| 3,484,239 | 12/1969 | Steppan et al. | 96/35.1 |
| 3,497,354 | 2/1970 | Steppan et al. | 96/35.1 |
| 3,539,343 | 11/1970 | Munder et al. | 96/35.1 |
| 3,776,729 | 12/1973 | Levy et al. | 96/115 R |
| 3,876,432 | 4/1975 | Carlick et al. | 96/115 R |

FOREIGN PATENTS OR APPLICATIONS 2,117,172   6/1972   France

*Primary Examiner*—William A. Powell
*Assistant Examiner*—Jerome W. Massie
*Attorney, Agent, or Firm*—Vincent J. Cavalieri

[57] ABSTRACT

A process for the manufacture of printed multilayer circuits by coating carrier films, which possess metal layers, with a light-sensitive material containing a compound with epoxide groups and with groups which can be cured by electromagnetic rays, by exposing the light-sensitive material through a transparent film which shows the negative image of the conductor traces to be produced, by developing with an organic solvent, by etching the metal layer and pressing the laminates together to form a multi-layer circuit. The parts of the light-sensitive layer which have been pre-cured by exposure to light are subjected to a thermal after-treatment using a curing agent for epoxide groups, whereby these parts are post-cured. These parts are not removed from the carriers films.

11 Claims, No Drawings

PROCESS FOR THE MANUFACTURE OF PRINTED MULTI-LAYER CIRCUITS

The manufacture of printed multi-layer circuits (multi-layers) has encountered considerable manufacturing difficulties in the past. For these reasons, the properties of these multi-layer circuits also leave a great deal to be desired. One method of building up such multi-layer conductor plates, which at the present time has found most application in production consists of pressing together copper-laminated prepregs or thin film laminates which already contain the circuit picture intended for the particular layer. The adhesive films and laminates used are very thin and form the insulant layers between the individual conductor planes. After the multi-layer conductor plates have been produced, the circuit connections and points of contact between the individual layers are produced by boring and subsequently producing a contact through these bores. The most diverse proposals for improvement have already been made in order to avoid the difficulties which arise, such as crack formation in the contact layer and in the intermediate layers, and delaminating effects during soldering or on exposure to fluctuating temperature. The process carried out in the art at the present time consists essentially of the following individual steps:

First, a thin film laminate which is laminated with copper on both sides and which as a rule has largely been cured but need not be fully cured is coated with a photoresist lacquer. This lacquer, which can be a negative lacquer or a positive lacquer, is covered with an appropriate mask, and exposed to light. Thereafter, the unexposed areas are eluted with a developer in the case of the negative lacquer. In the case of a positive lacquer, the exposed areas are eluted and the unexposed areas are used as an etching resist in the subsequent process. The developed resin layers which remain serve as a resist in the subsequent etching process for the copper. After removing the copper by etching, the desired circuit picture results, onto which the photo-etching resist lacquer adheres. In the case of the positive lacquer, the process is correspondingly reversed.

However, the commercially available photoresist lacquers, which in part are also marketed in the form of films, frequently possess inadequate insulating properties, poor adhesion and poor heat resistance. Before the next prepreg can be pressed onto this first base layer of the multi-layer circuit, the resists must therefore be removed. This is done by removing these resist lacquers with very aggressive organic solvents (stripping) and frequently with mechanical aids (brushes and the like). This stripping process very frequently attacks the surface of the synthetic resin which has been used to build up the laminate. Very frequently solvent residues also remain in the multi-layer circuit after the further layers of prepreg have been laminated on, which is why the multi-layer circuit must subsequently be heat-treated and carefully vacuum-treated since otherwise, as a rule, cracks and other defects occur at the latest on subsequent soldering.

The subject of the invention is now a process in which these disadvantages can be avoided. The process according to the invention for the manufacture of printed multi-layer circuits by coating carrier films, which possess metal layers which can be etched, with a light-sensitive material, exposing the light-sensitive material through a transparent film which shows a negative image of the conductor traces to be produced, developing with an organic solvent, whereby the unexposed parts of the light-sensitive material are dissolved out, treating the metal layer with an etching liquid and pressing the structures together to form a multi-layer circuit is characterised in that the light-sensitive material used is an organic material which contains a compound with epoxide groups and with groups which can be cured by electromagnetic rays, that the parts of the light-sensitive layer which have been pre-cured by exposure to light are subjected to a thermal after-treatment using a thermally active curing agent for epoxide resins, whereby these parts are post-cured, and that these parts are left on the carrier films.

A compound with 0.1 to 3.0, preferably with 0.4 to 1.0, epoxide group equivalents/kg is suitable for use as the compound with heat-curable epoxide groups and with groups which can be cured by electromagnetic rays. The resin advantageously contains about 2 epoxide groups per molecule.

The pressing together of the individual coated and treated carrier films is advantageously carried out with the interposition of adhesive films or films of prepregs, especially of prepregs which consist of a glass fabric impregnated with an epoxide resin and a curing agent for epoxide resins.

If covering layers are used, the metal-coated covering layers of the multi-layer circuit are provided, only after pressing, with a light-sensitive material and are exposed image-wise, developed and treated with an etching liquid.

Preferably, the light-sensitive material also contains a thermally active curing agent for the epoxide resin.

Light-sensitive materials are substances which undergo chemical change through electromagnetic radiation. Correspondingly, the term "exposure" denotes the action of electromagnetic rays on the material. Rays of wavelength 200–600 nm are particularly active.

The exposure can be carried out with sunlight, carbon arc lamps or xenon lamps. It is advantageous to use mercury high pressure lamps or metal halide lamps with outputs of 10 to 10,000 watt, especially 400–5,000 watt, which are allowed to act for between a few seconds and 20 minutes from a distance of 5 to 10 cm.

The carrier materials used for the etchable metal which is to be coated are preferably epoxide resin-impregnated paper sheets of glass fabrics. These carrier materials or laminates have good electrical and mechanical properties. Above all, glass fabrics impregnated with epoxide resins give laminates which meet the highest standards in respect of electrical and mechanical properties, such as are demanded at the present time in industrial electronics and aeronautical instrument electronics and in computer construction. The main requirements for numerous instruments in air travel and space travel, for example, are that the circuits should require as little space as possible and weigh as little as possible. Using the process according to the invention it is possible to construct, by production processes, multi-layer circuits which can withstand more severe thermal, climatic, mechanical and electrical conditions.

Copper, above all, can be used as the etchable metal layer on the carrier materials; in particular, electrolytic copper foils of highest purity in various thicknesses for lamination, for example thicknesses of 10–500 $\mu$m, especially 15–100 $\mu$m, are used.

Etching liquids which can be used are any commercially available materials, for example ferric chloride solutions and ammonium persulphate solutions. The etching is advantageously carried out in a 40% strength FeCl$_3$ solution at 40°C for 5–7 minutes or with a 30% strength (NH$_4$)$_2$S$_2$O$_8$ solution at the same temperature for 10–15 minutes.

The developing liquid used is an organic solvent or a mixture of such solvents which dissolve the unexposed layer but not the exposed plastics layer. Such solvents are known to those skilled in the art and are, for example, dimethylformamide, dimethylsulphoxide, glycol monoethyl ether, diglycol monoethyl ether, ethylglycol acetate, trimethylcyclohexanone, cyclohexanone and also mixtures of the solvents mentioned.

Compounds containing epoxide groups and light-sensitive groups are in part known, for example from U.S. Pat. Nos. 3,410,824, 3,295,974 and 3,278,305. Their use for the manufacture of printed circuits and the post-curing to achieve greater stability are, however, not described. In addition to these known compounds their pre-adducts, containing epoxide groups, with customary curing agents, such as acid anhydrides or polyamines, can also be employed advantageously for the process according to the invention. By varying the nature and amounts of the polyepoxides all light-sensitive compounds used as starting substances, all desired types of compounds containing epoxide groups, in which the light-sensitive groups are incorporated terminally into the polymer chain or are present as side-chains, can be manufactured. The epoxide group content can vary within wide limits, for example from 0.10 equivalent/kg to 3 equivalents/kg. The compounds preferably have an average molecular weight of between 5,000 and 8,000 (weight average).

The epoxide compounds on which the compounds are based can belong to the most diverse classes. For example, they can be built up from bisphenol A, novolacs, hydantoins, uracils and isocyanurates.

By way of examples, the light-sensitive compounds with epoxide groups are compounds corresponding to the following general formulae:

These compounds are manufactured according to methods which are in themselves known, for example by reaction of compounds containing two or more epoxide groups with compounds which contain light-sensitive groups and at least one, but preferably two, groups which react with epoxide groups, the compounds being reacted together in the most diverse molar ratios. The number of crosslinkable groups is then sufficiently large that after irradiation the crosslinking has progressed to the point that the resulting lacquer, which has been precured by the crosslinking by light, withstands the solvents used just sufficiently during the development process, and displays adequate stability towards the etching agents used during the subsequent etching process.

Epoxide resins according to structural formula I are obtained if, for example, an epoxide resin which has been obtained by reaction of a bisphenol with epichlorohydrin and has an epoxide group content of 3.0 to 5.5 equivalents/kg is reacted with a bisphenol, which contains light-sensitive groups, by the "advancement" process, until the reaction product still contains, as indicated above, 0.1 to 3.0 epoxide equivalents/kg.

Products according to structural formula II are obtained if, for example, an epoxide resin produced by reaction of a bisphenol containing light-curable groups, with epichlorohydrin is first manufactured. Thereafter this resin is reacted further with a normal bisphenol by the advancement process until the reaction product again contains 0.1 to 3.0 epoxide equivalents/kg.

Equally, it is possible to use, for the process according to the invention, mixtures of products according to structural formulae I + II, which are produced by physical mixing or which have been manufactured by advancement of an epoxide resin, which has been built up exclusively from epichlorohydrin and bisphenol possessing light-curable groups, and an epoxide resin which has been built up from a bisphenol and epichlorohydrin, by means of a bisphenol containing light-curable groups or an ordinary bisphenol or a mixture of both. Finally, it is possible to use physical mixtures of products according to structural formula I and II which

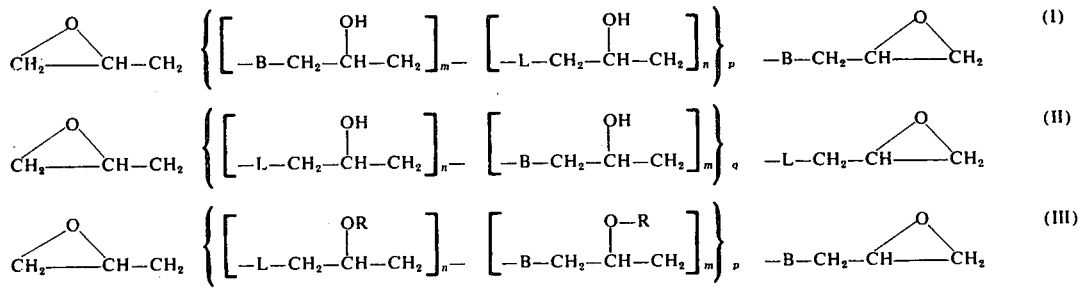

In these formulae, m denotes 0, 1, 2 or 3, n, p and q independently of one another denote 1, 2 or 3, B denotes an aliphatic, cycloaliphatic, araliphatic, aromatic or heterocyclic radical and L denotes a light-sensitive group which preferably contains a chalcone group or a light-sensitive group in which the double bond which can be crosslinked by light is not present in a side chain.

The radicals R denote hydrogen atoms which can, in part, be replaced by a radical containing a light-sensitive group.

have been built up using different bisphenols with light-curable groups. The groups "L," can also in each case be mixtures of several bisphenols which contain light-curable groups.

In each case, the advancement process can be carried out using monophenols which contain light-curable groups, or ordinary monophenols, as chain stoppers in a suitable manner.

Products according to structural formula III are obtained if, for example, an epoxide resin according to formula I or II is used and its free hydroxyl groups are partially reacted by trans-esterification, using an ester which contains light-crosslinkable groups. For this purpose, a less than equivalent amount of methyl esters, for example cinnamic acid methyl ester, are used in a known manner and the reaction is carried out at temperatures of 100–150°C, using suitable catalysts.

In addition to the epoxide resins manufactured by the advancement process and shown in structural formulae I, II and III, other epoxide compounds can also be employed for the process according to the invention. However, the ratio of the epoxide groups to the light-crosslinkable groups must in each case be such that the properties described above are retained after crosslinking by light and thermal crosslinking of the epoxide groups is possible. For example, it is possible to use glycidyl ethers of novolacs in which the glycidyl group has been partially reacted with a light-curable radical (structural formula IV)

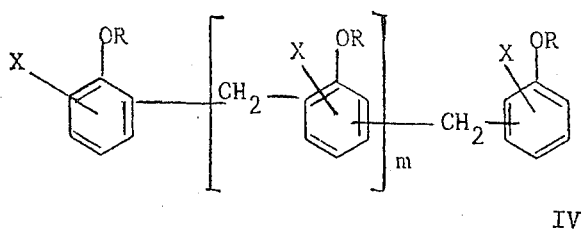

IV wherein $m = 0$ or an integer, preferably from 1 to 10, X denotes hydrogen or an aliphatic radical, for example an alkyl group with 1–4 carbon atoms, and R denotes the glycidyl group or a radical containing a light-sensitive group $L'$, it being possible for the ratio of the number of $L'$ groups to the number of glycidyl groups to vary within wide limits. In particular, X denotes hydrogen or the methyl group.

As a rule, curing agents are now added to the light-crosslinkable epoxide resins which have been described. These curing agents should however in each case be suited to the curing agents which are used to cure the epoxide resins contained in the adhesive films. In principle, all curing agents which are possible for the manufacture of prepregs can be used.

It is possible to add to the light-sensitive resins small amounts of sensitisers which reduce the exposure time or permit the use of light sources of lower output. In general it is disadvantageous to add monomolecular stabilisers or sensitisers and other non-polymeric additives where there is the danger that they may remain as monomolecular impurities in the crosslinked resin, particularly if these substances must be added in fairly high concentrations. The light-curable epoxide resins to be used for the process according to the invention largely make it superfluous to use these additives, because the concentration of light-crosslinkable groups can be kept within limits and because complete crosslinking of the lacquer layers by the photopolymerisation is not necessary.

The crosslinking of the resin which has occurred after exposure has progressed to a point that the lacquer produced has not yet become completely insoluble and infusible. The epoxide groups present in the lacquer can, during subsequent pressing together with a further layer of adhesive film or prepreg, undergo a crosslinking reaction with the epoxide resin used to build up the latter material. In that case, the epoxide resin used to build up this carrier film must still contain a sufficient number of reactive groups for cross-linking the epoxide groups of the resist lacquer or, preferably, the amount of curing agent required for crosslinking the epoxide groups of the resist lacquer must already have been introduced into the resist lacquer beforehand. In that case, the curing agent present in the light-crosslinkable resist lacquer must be compatible with the curable material which has been used to cure the resin of the adhesive film. After exposing and developing the light-sensitive epoxide resin lacquer, parts of the metal layer are bared for the etching process, and carrying out this process produces the circuit picture on the carrier film.

On pressing together the individual prepregs and circuit layers to give a multi-layer circuit (multi-layer laminate), a homogeneous insulating layer is thus produced between the individual conductor layers, and this insulating layer contains no volatile constituents and also displays no damage by the stripping process, since the latter has now been omitted. Admittedly, it has already been proposed previously to use photo-curable insulating materials which also remain in the multi-layer circuit. However, the process of this type which has been described is only concerned with a partial buildup of multi-layers. It mentions light-curable resins which have been manufactured by esterification of epoxide resins (DOS 1,937,508). However, these resins become extensively crosslinked during exposure. The multi-layer circuits produced therewith do not possess the high-quality thermal and mechanical properties necessary in industry. These previously mentioned resins are therefore unusable for the process according to the invention since they cannot be post-cured thermally and hence do not possess the requisite heat stability. Furthermore these epoxide-ester resins, which as a rule are epoxide resin polycinnamates, have to be stored particularly carefully and require the addition of polymerisation inhibitors in order to ensure constant properties after storage. It has been found that the light-sensitive lacquers used for the process according to the invention display, after thermal post-curing, excellent adhesion even to copper which has not been pretreated, and to the customary base materials. They furthermore give the first-class thermal and mechanical strengths of the epoxide laminating resins usually employed for the manufacture of base materials so that they can also be used as protective lacquers, but especially as solder-stopping lacquers.

The lacquering or coating is carried out according to the customary processes such as, for example, by whirler-coating, dipping, spraying and the like.

Examples A–F which follow describe the manufacture of some light-sensitive lacquers. Parts denote parts by weight.

EXAMPLE A 13.2 parts of an epoxide resin based on the bis-glycidyl-ether of bisphenol A, having an epoxide group content of 5.4 equivalents/kg, 11.1 parts of the light-sensitive compound of the formula V:

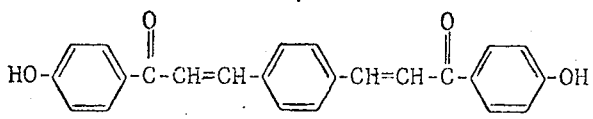

and 0.1 part of tetraethylammonium bromide as the catalyst, are warmed, together with 24.3 parts of 1-acetoxy-2-ethoxyethane, in a reaction flask equipped with a thermometer, stirrer and condenser. The mixture kept under nitrogen is heated to 140°C and left at this temperature until a sample thereof has an epoxide group content of 0.50 equivalent/kg of resin (without solvent). Thereafter the mixture is cooled to approx. 100°C and diluted with 32.0 g of cyclohexanone.

Product A which is obtained corresponds to a compound of the type of the formula I.

EXAMPLE B 3.80 parts of bisphenol A, 9.64 parts of the light-sensitive bis-epoxide of the formula VI:

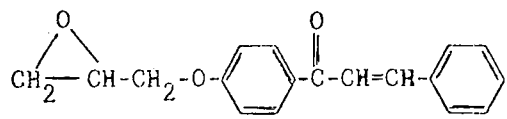

and 0.1 part of tetraethylammonium bromide, together with 100 parts of dimethylformamide, are allowed to boil under reflux, in the same manner as that described under A, until a sample shows an epoxide group content of 0.39 equivalent/kg of resin.

This product B corresponds to a compound of the type of the formula II.

EXAMPLE C 54.8 parts of an epoxide-phenol novolac having an epoxide group content of 5.6 equivalents/kg, 42.8 parts of the light-sensitive monophenol of the formula VII:

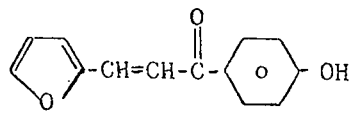

and 0.1 part of tetraethylammonium bromide are heated to 110°C until a sample of the product shows an epoxide group content of 1.10 equivalents/kg.

EXAMPLE D 6.24 parts of 1,3-diglycidyl-5,5-dimethyl-hydantoin of the formula VIII:

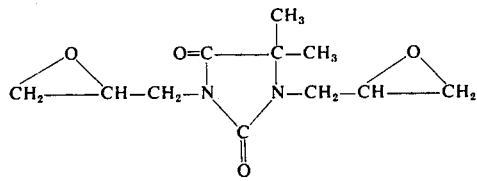

having an epoxide group content of 8.30 equivalents/kg, 7.4 parts of the light-sensitive bisphenol of the formula V

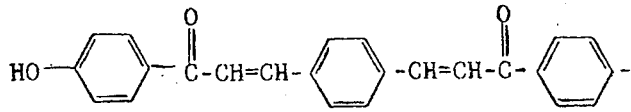

and 0.01 part of tetramethylammonium bromide are dissolved in 100 parts of dimethylformamide and the mixture is kept boiling under reflux at 153°C until a sample (without solvent) has an epoxide group content of 0.65 equivalent/kg.

The resulting product D corresponds to a compound of the type of the formula I.

EXAMPLE E 180 parts of a liquid epoxide resin based on bisphenol-A, having an epoxide group content of 5.45 equivalent/kg, 46.4 parts of the dihydroxychalcone of the formula IX:

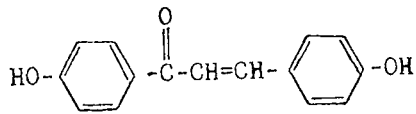

71.6 parts of the dihydroxychalcone of the formula V

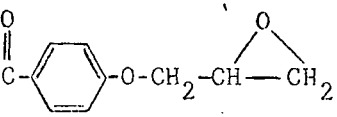

and 0.05 part of tetramethylammonium chloride in 68.2 parts of 1-acetoxy-2-ethoxy-ethane are mixed and the mixture is kept at 140°C until a sample shows an epoxide group content of 0.7 equivalent/kg. The product corresponds to a compound of the type of the formula I.

EXAMPLE F

In the same manner as described under A, 98 parts of the same liquid epoxide resin, 74 parts of the same light-sensitive compound of the formula V and 172 parts of dimethylformamide are kept, this time without catalyst, for 45 minutes at 150°C, until a sample shows an epoxide group content of 0.49 equivalent/kg of resin without solvent.

EXAMPLE 1

Build-up of a multi-layer circuit with 10 conductor planes.

100 parts by weight of a 30% strength solution of the light-sensitive epoxide resin manufactured under Example A are mixed with a solution of 0.5 part of 2,6xylyl-biguanide and 5 parts of monomethyl glycol ether. A film cut to standard size and laminated with copper on both sides, the film consisting of a layer of a glass fabric coated with epoxide resin and 2 layers of copper foil each of 35 $\mu$ thickness, is coated in this solution by impregnation dipping. The speed of travel during dipping is 5 cm/minute. The film coated in this way is subsequently dried for 10 minutes at 90°–100°C in a circulating air oven. After cooling to room temperature, a thin, dry and scratch-resistant lacquer of 10 $\mu$ thickness, which shows good adhesion to the copper, is obtained on the foil. The laminate coated in this way is covered on both sides with a transparent film which contains the negative of the conductor traces to be produced. The exact position of the conductor traces is held by fixing in an appropriate frame. Thereafter, the resin is subjected to a vacuum in a vacuum frame and is irradiated from both sides with a 1,000 watt mercury high pressure lamp at a distance of 10 cm for 50 seconds. After taking out of the holder, and removing the negatives, the unexposed parts of the resin are dissolved out in a mixture of 40 parts of cyclohexanone, 40 parts of trimethylcyclohexanone and 20 parts of toluene. The image developed in this way is rinsed down with water. Thereafter etching is carried out in a continuous etching machine in 40% strength $FeCl_3$ solution at 40°C for 4.5 minutes. A conductor image with high sharpness of contours is produced.

Using the same method, 2 further thin film laminates with the corresponding conductor traces on both sides are produced. To produce the covering layers, the corresponding conductor image is merely applied to one side; the copper lamination, which later forms the outside of the laminate, is masked with a temporary etch-protecting layer, using an adhesive film. The five layers of film are now joined together by pressing, in each case being joined by means of a laminate prepreg consisting of a glass fabric coated with epoxide resin (NORPLEX Grade BG-4, a commercial product of Messrs. NORPLEX, La Crosse, Wisconsin, USA), and the pressing being carried out for 30 minutes at 160°C using a pressure of 15 kg/cm².

Thereafter, the laminate is bored and the corresponding holes are through-metallised in the usual manner so as to connect the conductor traces in the individual layers. Finally, the circuit is applied to the covering layers in the conventional manner, using a customary photoresist lacquer or using the light-sensitive epoxide lacquer which has also been used for the inner layers. This lacquer is thereafter, however, removed again by stripping by means of a suitable solvent.

Finally, the bared copper is covered by tin dipping at 260°C, and the excess tin is removed by treatment with polyglycols.

Whilst the multi-layer circuits manufactured according to the customary process delaminate after only a short treatment in the tin-plating bath and/or on spraying with polyglycol, 6 10-layer circuits manufactured according to the present process show no defect whatsoever. The multi-layer laminate produced was extremely resistant to soldering (>1 minute at 260°C) and shows no delamination even in the areas of rather broad copper conductor traces. The 10-layer circuit produced shows very good adhesion of the intermediate layers and high mechanical strength.

EXAMPLE 2

Multi-layer (circuits) are manufactured in the same manner as described in Example 1, using a lacquer according to Example C, structural formula IV:

50 parts of the resin are dissolved in 75 parts of monomethyl glycol ether and 1.9 parts of 2,6-xylyl-biguanide are added as the curing agent. 1% of Michler's ketone — relative to the solids content — is used as the sensitiser.

The Cu-laminated thin film laminate was coated as in Example 1 by means of a dip-coating instrument. The lacquer film which is covered with the appropriate negatives in a vacuum frame, is exposed for 6 minutes to a 400 watt mercury high pressure lamp from a distance of 10 cm. Approx. 60 seconds are required to dissolve out the unexposed parts of the resin with monoethyl glycol ether.

The further processing steps to give the finished multilayer circuit, such as etching, pressing, soldering and the like, are carried out in accordance with the conditions indicated in Example 1, and the material stands up well to the heat exposures entailed thereby.

EXAMPLE 3

Manufacture of a protective lacquer for multi-layer circuits

A multi-layer circuit which already contained the requisite bores, with contact made right through these, is coated with a solution of a lacquer consisting of 400 parts of a 50% strength resin corresponding to Example E, of epoxide equivalent weight 0.6 (relative to the solid resin), and 5.0 parts of 2,6-xylyl-biguanide, dissolved in 50 parts of monomethyl glycol ether, using a roller-coater with rubber-coated and ribbed rollers. The coated multi-layer circuits are then introduced into a vacuum drying cabinet and the solvent is evaporated off for at least 30 minutes at 50°C and approx. 50 mm Hg. To remove the residual solvent, the laminate is subsequently dried for a further 10 minutes at 100°C and at the same time the resin is converted to a pre-polymerised state. The lacquer film thus applied is dry, has good adhesion to the base material and is approx. 40 μ thick. The multi-layer circuit is cooled to room temperature and is then placed in a fixing frame together with the corresponding mask, transferred to a vacuum frame and irradiated therein for 40 seconds by a 5,000 watt metal halide lamp from a distance of 60 cm. The unexposed parts of the resin are subsequently dissolved out with a mixture of cyclohexanone and trimethylcyclohexanone in the ratio of 70:30, it being necessary to take particular care that the resin is also dissolved completely out of the bores in which contact had been made right through. The time required for the dissolving process is 3½ to 4 minutes. The laminate is then rinsed with water and warm air is blown over it until it is dry. The thermal curing of the resin is carried out in two steps: First, the film is pre-cured for 30 minutes at 120°C, and then it is fully cured by 60 minutes' heat treatment at 160°C.

A lacquer manufactured according to this process is extremely scratch-resistant and solvent-resistant and above all shows good heat resistance. Thus, for example, samples of this type are stored for 48 hours in solvents such as acetone, ethyl alcohol, toluene, trichloroethane and the like, at room temperature. After this time, the test specimens are rinsed down with water and dried for 30 minutes at 50°C. In all samples, the lacquer is undamaged. For comparison, a normal laminate according to NEMA-G-10 is also exposed to the above solvents for 48 hours. It shows distinct swelling or delamination phenomena in the case of the more aggressive solvents such as trichloroethane. To test the heat resistance of the lacquer, samples which have been manufactured according to the process described above are immersed in a soldering bath at 270°C. After 10 minutes' immersion time, a slight darkening can admittedly be observed, but no damage to the lacquer is observable.

Further properties of the light-sensitive resins used in Examples 1–3 are described in more detail by the following tests:

I. Optical resolution

To test the optical resolution, a laminate covered with Cu on one side is coated with the solution of the lacquer used in Example 1, by the whirler-coating process, and the solvent is then evaporated from the sample for 10 minutes at 100°C in a drying cabinet. The resin layer which remains is about 10 $\mu$ thick. After cooling to room temperature, the so-called "Stouffer wedge" is placed as a mask on the resin layer and irradiated in a vacuum frame by a 5,000 watt metal halide lamp at a distance of 60 cm. Thereafter, the unexposed parts of the resin are dissolved out with the solvent mixture described in Example 1 and the whole is rinsed down with water. In the subsequent etching process with 40% strength $FeCl_3$ solution, the bared copper is etched away over the course of 6 minutes at room temperature. After a further washing and drying process, the samples are assessed under the microscope. The wedges obtained show good resolution practically to the apex and still show good sharpness of contours even at scale division 1. Equally the point screens and the fine grids to the right and left of the wedges can be developed and etched perfectly.

II. Electrical and general properties of the laminate duced by gentle warming. After cooling, the two solutions are mixed at room temperature, whereby an impregnating solution with a viscosity of approx. 150 cP/25°C is produced. A glass fabric having a weight per unit area of 200 g/m² and a linen binding, the fabric beng finished with a chromium methacrylate complex finish ("Volan A," a registered tradename) is coated by simple impregnation dipping. Thereafter, the solvent is evaporated off for 8 minutes at 150°C in a drying cabinet. The resulting dry prepreg is cut to the correct size and several such layers are stacked to form a bundle for pressing. As the covering layers, a 35 $\mu$ thick Cu foil (type G 2 of Messrs. CLEVITE) is placed on each face, in such a way that the pretreated side of the foil faces inward. The bundle for pressing is then wrapped in a polyvinyl fluoride release film (registered trademark "Tedlar" of Messrs. Du Pont) and placed in a press heated to 170°–175°C. The press is then brought to contact pressure. After about 2 minutes' contact time, the press pressure is raised to 15 kp/cm² and thereafter the resin is cured for 1 hour at 170°–175°C; this gives test specimen P.

In parallel thereto, bundles for pressing are produced from laminates using pure laminating resin L. After cooling, the properties shown in Table 1 are determined on laminates P and L.

Table 1

|  | Test specimen P | Comparison laminate L |
| --- | --- | --- |
| Breakdown strength vertically to the layer (kV/cm) | 260 | 270 |
| Dielectric loss factor tan $\delta$, 23°C/10⁶Hz (%) | | |
| Initial value | 1.73 | 2.03 |
| After 24 hours storage in $H_2O$ | 1.80 | 2.23 |
| After 48 hours storage in $H_2O$/50°C | 2.09 | 3.71 |
| Dielectric constant $\epsilon_r$, 23°C, 10⁶Hz (%) | | |
| Initial value | 5.6 | 5.4 |
| After 24 hours in $H_2O$/23°C | 5.6 | 5.4 |
| After 48 hours in $H_2O$/50°C | 5.5 | 5.8 |
| Specific volume resistance ($\Omega$. cm) | | |
| Initial value | $5.5 \times 10^{15}$ | $2.7 \times 10^{15}$ |
| After 24 hours storage in $H_2O$/23°C | $1.3 \times 10^{15}$ | $1.1 \times 10^{15}$ |
| After 90 hours storage at 40°C/92% relative atmospheric humidity | $3.3 \times 10^{14}$ | $1.2 \times 10^{15}$ |
| Surface resistance ($\Omega$) | | |
| Initial value | $4.4 \times 10^{12}$ | $2.4 \times 10^{13}$ |
| After 90 hours storage at 40°C/92% relative atmospheric humidity | $3.2 \times 10^{12}$ | $3.0 \times 10^{12}$ |
| Transition temperature (°C) (from torsional modulus) | 100–105 | 90 |
| Adhesion of Cu (kp/inch) | | |
| Room temperature | 4.3–4.6 | 4.6–4.8 |
| 120°C | 2.3–2.4 | 2.3–2.6 |
| $H_2O$ absorption (%) | | |
| After 24 hours/23°C | <0.1 | <0.1 |
| After 1 hour/100°C | 0.5 | 0.7 |

According to the process of the invention, the epoxide resin layer which remains after exposure and developing, the so-called the photoresist, is not removed from the carrier film. Since the epoxide compounds which have been exposed to light soften again on subsequent pressing and in doing so mix with the resin and curing agent of the adhesive film, a boundary zone of adhesive film/photoresist is formed, the properties of which are examined and compared with those of customary (pure) laminating resin.

In detail, the experiments are carried out as follows: 200 parts of an epoxide resin L (epoxide group equivalents/kg = 2-2.2, melting point, 68–78, manufactured from a bisphenol-A epoxide resin advanced with bisphenol-A) are mixed with 400 parts of the resin solution manufactured according to Example A. Separately therefrom, a solution of 9 g of dicyandiamide (cyanoguanidine) in 150 g of monomethyl glycol ether is pro-

III. Test of adhesion of Cu

The adhesion of the copper to the photoresist is tested by means of the following test:

A 10–15 $\mu$ thick resin film is applied to the glossy side of a 35 $\mu$ thick copper foil of type G 2 of Messrs. CLEVITE, using the whirler-coating process. The lacquer used corresponds to the material used in Example 1. 14 layers of an epoxide resin/glass fabric prepreg corresponding to NEMA FR-4 were stacked on top of one another. The copper foil is applied as a final layer so that the coated side faces inwards. Pressing to give a laminate is carried out in accordance with the conditions described above. After cooling the laminate, the adhesion of the Cu is determined on a Cu peel-tester on test specimens 10 cm long and 1.27 cm wide, following the guide lines indicated in MIL-P-13,949-E.

Room temperature: 3.6 – 4.2 kp/inch
120°C: 2.0 kp/inch

A commercial photoresist shows no adhesion to copper whatsoever.

We claim:
1. Process for the manufacture of printed multi-layer circuits by coating carrier films, which possess metal which can be etched, with a light-sensitive material, exposing the light-sensitive material through a transparent film which shows the negative image of the conductor traces to be produced, developing with an organic solvent, whereby the unexposed parts of the light-sensitive material are dissolved out, treating the metal layers with an etched liquid and pressing the structures together to form a multi-layer circuit, characterized in that the light-sensitive material used is a compound containing epoxy groups and groups which can be cured by electromagnetic rays, said compound containing from 0.1 to 3.0 epoxide group equivalent/kg, that the parts of the light-sensitive layer which have been pre-cured by exposure to light are subjected to a thermal after-treatment using a thermally active curing agent for epoxide resins, whereby these parts are post-cured, and that these parts are left on the carrier films.

2. Process according to claim 1, characterised in that an epoxide resin is used in which the epoxide group equivalent/kg of resin is between 0.4 and 1.0.

3. Process according to claim 1, characterised in that an epoxide resin which possesses approximately two epoxide groups per molecule is used at the material containing light-sensitive groups and epoxide groups.

4. Process according to claim 1, characterised in that the light-sensitive material contains a curing agent for epoxide resins.

5. Process according to claim 1, characterised in that the individual coated, exposed, developed and etched layers are pressed, together with laminating films placed between them, under the action of heat, whereupon the curing of the compounds containing epoxide groups takes place simultaneously.

6. Process according to claim 5, characterised in that the laminate film used is a glass fabric impregnated with an epoxide resin and a curing agent for epoxide compounds.

7. Process according to claim 1, characterised in that a light-sensitive material is used which contains at least one compound of the formula I

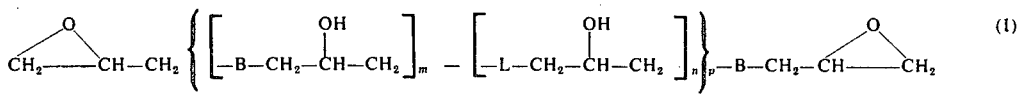 (I)

in which m denotes 0, 1, 2 or 3 and n and p independently of one another denote 1, 2 or 3, B denotes an aliphatic, cycloaliphatic, araliphatic, aromatic or heterocyclic radical and L denotes a light-sensitive group which preferably contains a chalcone group.

8. Process according to claim 1, characterised in that a light-sensitive material is used which contains at least one compound of the formula II

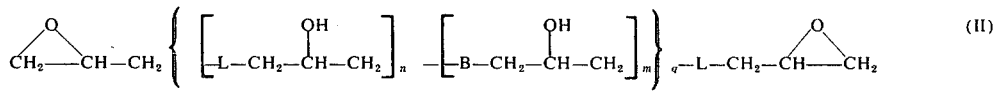 (II)

in which m denotes 0, 1, 2 or 3, n and q independently of one another denote 1, 2 or 3, B denotes an aliphatic, cycloaliphatic, araliphatic, aromatic or heterocyclic radical and L denotes a light-sensitive group which preferably contains a chalcone group.

9. Process according to claim 1, characterised in that a light-sensitive material is used which contains at least one compound of the formula III

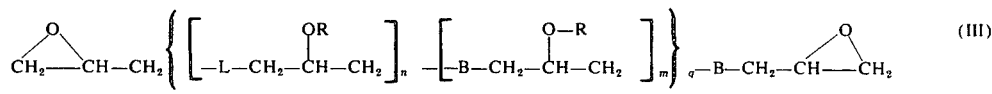 (III)

in which m denotes 0, 1, 2 or 3, n and p independently of one another denote 1, 2 or 3, B denotes an aliphatic, cycloaliphatic, araliphatic, aromatic or heterocyclic radical, L denotes a light-sensitive group which preferably contains a chalcone group and the radicals R represent hydrogen atoms which can in part be replaced by radicals possessing a light-sensitive group.

10. Process according to claim 1, characterised in that a light-sensitive material is used which contains at least one compound of the formula IV

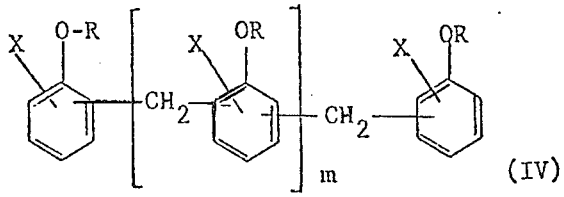

(IV)

in which m=0 or an integer, preferably 1 to 10, and X denotes hydrogen or an aliphatic group and R represents the glycidyl group or a radical containing a light-sensitive group, with at least one radical R representing the glycidyl group and at least one radical R representing the radical L'.

11. Process according to claim 10, characterised in that X in the formula IV denotes hydrogen or the methyl group.

* * * * *

UNITED STATES PATENT AND TRADEMARK OFFICE
CERTIFICATE OF CORRECTION

PATENT NO. : 3,956,043
DATED : May 11, 1976
INVENTOR(S) : Abdul-Cader Zahir, Heinz Rembold, Ewald Losert It is certified that error appears in the above-identified patent and that said Letters Patent are hereby corrected as shown below:

Page 1, line 4, delete "Remabold" and insert therefor ---Rembold---.

Page 9, column 13, line 45, after used, delete "at" and insert therefor ---as---.

Signed and Sealed this twenty-sixth Day of July 1977

[SEAL]

Attest:

RUTH C. MASON
*Attesting Officer*

C. MARSHALL DANN
*Commissioner of Patents and Trademarks*

UNITED STATES PATENT AND TRADEMARK OFFICE
CERTIFICATE OF CORRECTION

PATENT NO. : 3,956,043
DATED : May 11, 1976
INVENTOR(S) : Abdul-Cader Zahir, Heinz Rembold, Ewald Losert It is certified that error appears in the above-identified patent and that said Letters Patent are hereby corrected as shown below:

Column 13, line 12, after the word "metal", insert --- layers ---.

Signed and Sealed this

Twenty-fifth Day of July 1978

[SEAL]

Attest:

RUTH C. MASON
Attesting Officer

DONALD W. BANNER
Commissioner of Patents and Trademarks